US012302682B2

(12) United States Patent
Chang et al.

(10) Patent No.: US 12,302,682 B2
(45) Date of Patent: May 13, 2025

(54) STRUCTURE OF THE PHOTODIODE

(71) Applicant: RAYNERGY TEK INCORPORATION, Hsinchu (TW)

(72) Inventors: Yi-Ming Chang, Hsinchu (TW); Kuen-Wei Tsai, Hsinchu (TW)

(73) Assignee: RAYNERGY TEK INCORPORATION, Hsinchu (TW)

( * ) Notice: Subject to any disclaimer, the term of this patent is extended or adjusted under 35 U.S.C. 154(b) by 528 days.

(21) Appl. No.: 17/892,735

(22) Filed: Aug. 22, 2022

(65) Prior Publication Data

US 2023/0057435 A1    Feb. 23, 2023

Related U.S. Application Data

(60) Provisional application No. 63/235,868, filed on Aug. 23, 2021.

(51) Int. Cl.
*H10K 30/82* (2023.01)

(52) U.S. Cl.
CPC ................... *H10K 30/821* (2023.02)

(58) Field of Classification Search
None
See application file for complete search history.

(56) References Cited

U.S. PATENT DOCUMENTS

| 2012/0018719 A1* | 1/2012 | Zan ................... H10K 30/65 257/43 |
| 2016/0254101 A1* | 9/2016 | Forrest .............. H10K 30/211 136/256 |
| 2018/0047922 A1* | 2/2018 | Forrest .............. H10F 77/413 |
| 2019/0334048 A1 | 10/2019 | Omelchenko |
| 2023/0129045 A1* | 4/2023 | Chang ............... H10K 85/151 257/40 |

FOREIGN PATENT DOCUMENTS

| CN | 105493295 A | 4/2016 |
| CN | 107534066 A | 1/2018 |
| CN | 113054110   | 6/2021 |

(Continued)

OTHER PUBLICATIONS

Taiwan Patent Office "Office Action" issued on May 30, 2023, Taiwan.

(Continued)

*Primary Examiner* — Benjamin P Sandvik
(74) *Attorney, Agent, or Firm* — WPAT, PC

(57) ABSTRACT

The present invention relates to a structure of photodiode, which comprises a substrate, a first electrode, an electron transport layer, a photoactive layer, a filter layer, and a second electrode. The first electrode is disposed on the substrate. The electron transport layer is disposed on the first electrode. The photoactive layer is disposed on the electron transport layer. The photoactive layer has a first energy gap value. The filter layer is disposed on the photoactive layer and has a second energy gap value. The second electrode is disposed on the filter layer. The second energy gap value is greater than the first energy gap value. The ratio of the second energy gap value to the first energy gap value is an energy gap ratio. The energy gap ratio is greater than 1 and less than or equal to 3.

10 Claims, 4 Drawing Sheets

(56) References Cited

FOREIGN PATENT DOCUMENTS

| JP | 2001168354 A | 6/2001 |
|----|--------------|--------|
| JP | 2012160770 A | 8/2012 |
| JP | 2016532301 | 10/2016 |
| JP | 2017-005196 A | 1/2017 |
| JP | 2017168499 A | 9/2017 |
| JP | 2017536698 A | 12/2017 |
| JP | 2019507954 A | 3/2019 |
| JP | 2019087727 A | 6/2019 |
| TW | I661571 B | 6/2019 |
| TW | 202034535 A | 9/2020 |
| TW | 202101781 A | 1/2021 |
| WO | WO2016208579 A | 12/2016 |
| WO | WO2020008839 A | 1/2020 |

OTHER PUBLICATIONS

Japan Patent Office "Office Action" issued on Aug. 22, 2023, Japan.
Ardalan Armin, et al., Narrowband light detection via internal quantum efficiency manipulation of organic photodiodes, Nature Communications, Published Feb. 27, 2015, DOI: 10.1038/ncomms7343.
Boming Xie, et al., Self-filtering narrowband high performance organic photodetectors enabled by manipulating localized Frenkel exciton dissociation, Nature Communications, https://doi.org/10.1038/s41467-020-16675-x.
Japan Patent Office Official action on Feb. 13, 2024.

\* cited by examiner

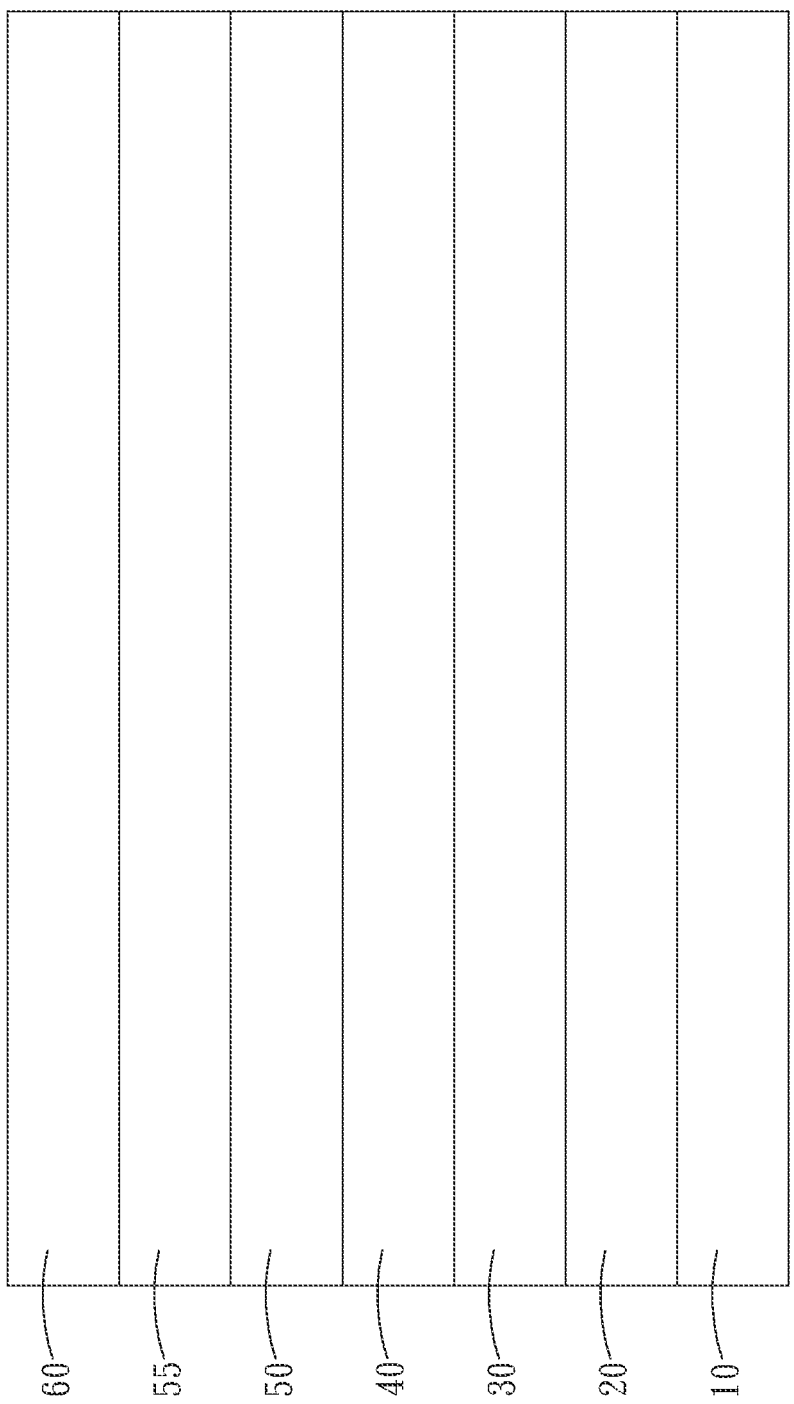

STRUCTURE OF THE PHOTODIODE

FIELD OF THE INVENTION

The present invention relates generally to a structure, and particularly to a structure of photodiode capable of self-filtering specific wavelengths.

BACKGROUND OF THE INVENTION

The general photodetector is mainly formed by a photodiode. In the past, silicon is the mainstream material. Nonetheless, in recent years, under the requirements of higher sensitivity, wider sensing range of wavelength, and higher performance to cost ratio, many photodiodes developed using next-generation material systems start to become attractive, such as organic photodetectors (OPD), quantum dot photodetectors (QDPD), and perovskite photodetectors (PPD).

A photodetector is a component of an image sensing product capable of converting the generated current signals into digital signals. Normally, a readout integrated circuit (ROIC) is accompanied.

The ROIC can be classified into two applications, including complementary metal-oxide-semiconductor (CMOS) chips and thin-film transistor (TFT) panels belonging to semiconductor factories and panel factories, respectively, in manufacturing and supply chain. The shipment units of image sensors are increased as product types are diversified. Thanks to the prevalence of mobile phones and novel embedded applications in the past ten years, image sensors have become the fastest growing semiconductor product type.

In the future, the new growth will be driven by embedded digital imaging systems, including more cameras for driving safety, driver assistive functions, built-in automated and intelligent machine vision, medical applications, human and face recognition, wearable cameras, 3D video conferencing, and virtual/augmented reality and other applications. The most important thing is that more image sensors with rapid and high resolution will be included in smartphones.

Nonetheless, general photodetectors will perform light splitting according to different requirements in applications. According to the prior art, a filter should be adopted to split white light into red, green, blue, and near infrared (R/GB/NIR) light sources. Thereby, a back-end process for filters must be incorporated into device structures.

Technically, if a narrow full-width at half maximum (FWHM) and a single optical frequency response can be given by device design and optical modulation without filter, the size of sensors can be shrunk and many advantages in process and costs will be given. If a photodiode can have a single frequency response by self-filtering without using filter, the size of sensors can be shrunk and the process complexity and costs can be reduced.

Among current photodiode technologies with narrow FWHM response using self-filtering, most device architectures are built on indium tin oxide (ITO) transparent substrates. Although current technologies can effectively verify the result of narrow FWHM response using self-filtering, the device architecture and process steps can not be directly applied to practical image sensor applications.

Because a cross-linked self-filtering layer adopts p-type molecules, it should be disposed between the photoactive layer and the ITO substrate to meet requirements in energy band. Then the process steps will be limited by the device structure. In general, the process steps in order include the transparent substrate, the transparent electrode, the hole transport layer (HTL), the filter layer (FL), the photoactive layer (PAL), the electron transport layer (ETL), and the top electrode. The structure described above will contradict the architecture of integrating OPD/QDPD/PPD on ROIC. Since OPD/QDPD/PPD should be fabricated right after ROIC, which normally has little optical transparency, a transparent top electrode must be used on the OPD/QDPD/PPD structure to form the so-called top-light photodiode structure.

Unfortunately, even the above structure, including the transparent substrate, the transparent electrode, the HTL, the FL, the PAL, the ETL, and the transparent top electrode, is completed, when the incident light enters from the transparent top electrode, the self-filtering effect cannot be achieved since the filter layer is located below the PAL.

Accordingly, how to fabricate a structure of photodiode capable of self-filtering and preventing inability of filtering specific wavelength owing to coverage of the filter layer by PAL has become the major problem to be solved in the field.

SUMMARY

An objective of the present invention is to provide a structure of photodiode, which disposes the filter layer on the photoactive layer. By using the difference in energy gap value between the filter layer and the photoactive layer, the filter layer can filter specific wavelengths of the external light source. The filtered light enters the photoactive layer to perform excitation, and hence achieving self-filtering effect and reducing the size of photodetectors.

The present invention provides a structure of photodiode, which comprises a substrate, a first electrode, an electron transport layer, a photoactive layer, a filter layer, and a second electrode. The first electrode is disposed on the substrate. The electron transport layer is disposed on the first electrode. The photoactive layer is disposed on the electron transport layer. The photoactive layer has a first energy gap value. The filter layer is disposed on the photoactive layer and has a second energy gap value. The second electrode is disposed on the filter layer. The second energy gap value is greater than the first energy gap value. The ratio of the second energy gap value to the first energy gap value is an energy gap ratio. The energy gap ratio is greater than 1 and less than or equal to 3.

According to an embodiment of the present invention, the substrate includes silicon substrate, polyimide substrate, glass substrate, polyethylene naphthalate substrate, polyethylene terephthalate substrate, sapphire substrate, quartz substrate, or ceramic substrate.

According to an embodiment of the present invention, the first electrode is a transparent electrode or a metal electrode. The transparent electrode is selected from the group consisting of metal oxide, conductive polymer, graphene, carbon nanotube, metal nanowire, and metal mesh. The metal electrode is selected from the group consisting of aluminum, silver, gold, copper, tungsten, molybdenum, and titanium or a composite metal electrode using the above metals with different elements.

According to an embodiment of the present invention, the electron transport layer is selected from the group consisting of $SnO_2$, $ZnO$, $TiO_2$, $Cs_2CO_3$, $Nb_2O_5$, PDMAEMA, and PFN—Br.

According to an embodiment of the present invention, the structure of photodiode further comprises a hole transport layer disposed between the filter layer and the second electrode.

According to an embodiment of the present invention, the hole transport layer is selected from the group consisting of PEDOT:PSS, $MoO_3$, NiO, $V_2O_5$, $WO_3$, CuSCN, spiro-MeOTAD, and PTAA.

According to an embodiment of the present invention, the photoactive layer is selected form the group consisting of P3HT, PCBM, PTB7, N2200, PM6, PBDB-T, Y6, IT4F, $CH_3NH_3PbI_3$, $CsPbI_3$, $CH_3NH_3PbBr_3$, $CsPbBr_3$, ZnS, CdSe, ZnSe, CdS and InP.

According to an embodiment of the present invention, the filter layer is selected from the group consisting of P3HT, PTB7, PM6, PBDB-T, $CH_3NH_3PbI_3$, $CsPbI_3$, $CH_3NH_3PbBr_3$, $CsPbBr_3$, ZnS, CdSe, ZnSe, CdS, and InP.

According to an embodiment of the present invention, the photoactive layer further includes one or more donor compound and one or more acceptor compound.

According to an embodiment of the present invention, the second electrode includes metal oxide, metal, conductive polymer, carbon-based conductor, metal compound, or a conductive thin film formed by alternately stacking the above materials.

BRIEF DESCRIPTION OF THE DRAWINGS

FIG. 3 shows a schematic diagram of the structure of photodiode according to another embodiment of the present invention.

DETAILED DESCRIPTION

Among current photodiode technologies with narrow FWHM response using self-filtering, most device architectures are built on ITO transparent substrates. Although current technologies can effectively verify the result of narrow FWHM response using self-filtering, the device architecture and process steps cannot be directly applied to practical image sensor applications.

The present invention is to provide a structure of photodiode that disposes the filter layer on the photoactive layer. By using the structure, specific wavelengths of the external light source can be filtered directly and hence achieving self-filtering effect and reducing the size of photodetectors.

Figure 1:
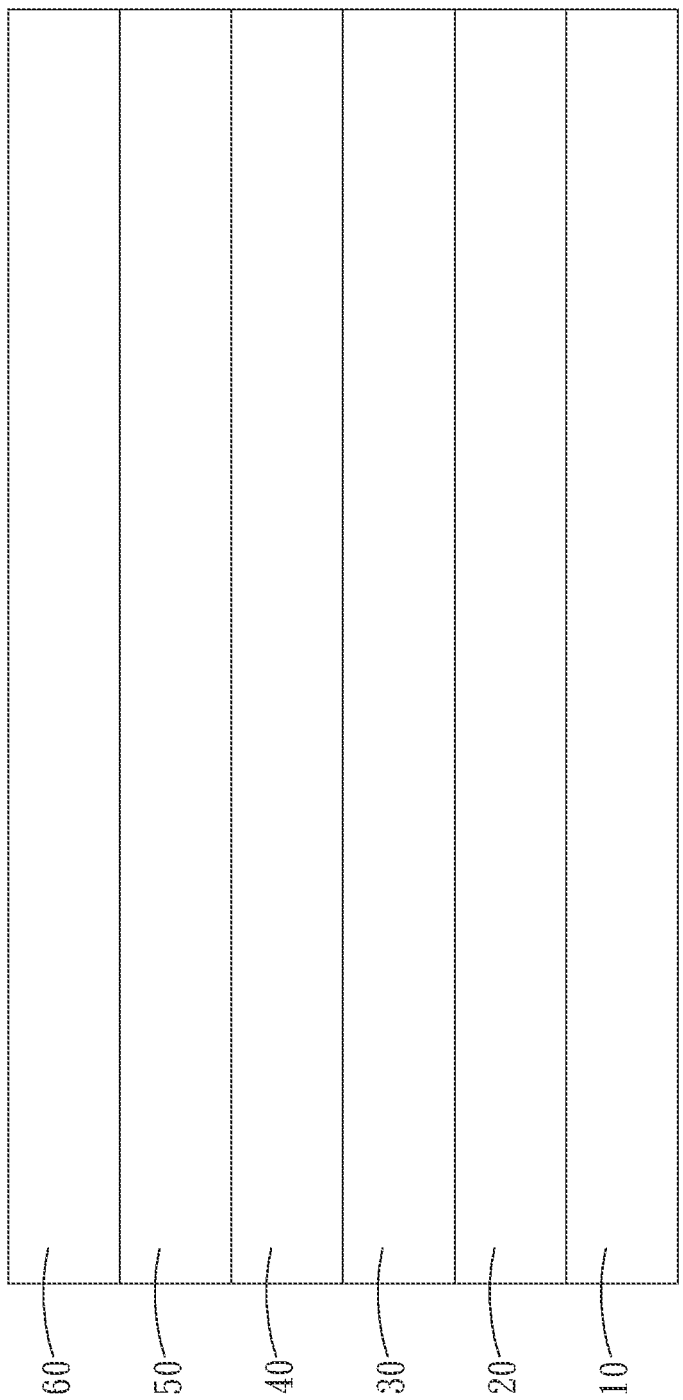
FIG. 1 shows a schematic diagram of the structure of photodiode according to an embodiment of the present invention.

First, please refer to FIG. 1, which shows a schematic diagram of the structure of photodiode according to an embodiment of the present invention. As shown in the figure, the structure of photodiode according to the present embodiment comprises a substrate 10, a first electrode 20, an electron transport layer 30, a photoactive layer 40, a filter layer 50, and a second electrode 60.

In the structure of photodiode according to the present embodiment, the first electrode 20 is disposed on the substrate 10 and the electron transport layer 30 is disposed on the first electrode 20. The substrate 10 includes silicon substrate, polyimide substrate, glass substrate, polyethylene naphthalate substrate, polyethylene terephthalate substrate, sapphire substrate, quartz substrate, or ceramic substrate.

The first electrode 20 is a transparent electrode or a metal electrode. Preferably, the first electrode 20 is, but not limited to, a transparent electrode. When the first electrode 20 as described above adopts the transparent electrode, the transparent electrode is selected from the group consisting of metal oxide, conductive polymer, graphene, carbon nanotube, metal nanowire, and metal mesh.

When the first electrode 20 adopts the metal electrode, the metal electrode is selected from the group consisting of aluminum, silver, gold, copper, tungsten, molybdenum, and titanium or a composite metal electrode using the above metals with different elements such as TiN or alike.

According to present embodiment, the electron transport layer 30 is selected from the group consisting of $SnO_2$, ZnO, $TiO_2$, $Cs_2CO_3$, $Nb_2O_5$, PDMAEMA, and PFN—Br.

According to the present embodiment, the photoactive layer 40 is disposed on the electron transport layer 30; the filter layer 50 is disposed on the photoactive layer 40; and the second electrode 60 is disposed on the filter layer 50. In addition, the photoactive layer 40 has a first energy gap value and the filter layer 50 has a second energy gap value.

The photoactive layer 40 is selected form the group consisting of $CH_3NH_3PbI_3$, $CsPbI_3$, $CH_3NH_3PbBr_3$, $CsPbBr_3$, ZnS, CdSe, ZnSe, CdS, InP, P3HT, PCBM, PTB7, N2200, PM6, PBDB-T, Y6, and IT4F.

The filter layer 50 is selected from the group consisting of P3HT, PTB7, PM6, PBDB-T, $CH_3NH_3PbI_3$, $CsPbI_3$, $CH_3NH_3PbBr_3$, $CsPbBr_3$, ZnS, CdSe, ZnSe, CdS, and InP.

The photoactive layer 40 according to the present embodiment receives an external light source, which can be a light source with specific or full wavelength, and converts the external light source into current. The material of the photoactive layer 40 enables light-induced electron response and owns charge transport capability.

According to the present embodiment, by using materials with different energy gaps, the filter layer 50 can filter specific wavelengths from the external light source.

According to the present embodiment, the second energy gap value is greater than the first energy gap value. The ratio of the second energy gap value to the first energy gap value is an energy gap ratio. The energy gap ratio is greater than 1 and less than or equal to 3.

Furthermore, according to the present embodiment, the photoactive layer 40 further includes one or more donor compound and one or more acceptor compound. In other words, the photoactive layer 40 in the structure of photodiode according to the present embodiment can be formed by the one or more donor compound and the one or more acceptor compound. Alternatively, the photoactive layer 40 can be a mixed layer.

To fabricate the structure of photodiode according to the present embodiment, an ITO transparent electrode can be manufactured on the substrate 10 by sputtering or a metal electrode can be manufactured on the substrate 10 by thermal evaporation for disposing the first electrode 20 on the substrate 10. Next, to dissolve polymeric electron transport material or metal oxide soluble in polar solvent in alcohol solvent, and then form the electron transport layer 30 on the first electrode 20 by spin coating. The above polar solvent includes alcohols, water-soluble solvent, dimethyl sulfoxide (DMSO), or dimethylformamide (DMF). In the above description, the alcohol solvent is used as an example. The present invention is not limited to the embodiment.

Then, organic photoactive material is dissolved in a common organic solvent, such as xylene, toluene, tetrahydrofuran, chloroform, chlorobenzene, dichlorobenzene, and coating the solution on the electron transport layer 30 to form the photoactive layer 40. The photoactive layer 40 is located on the electron transport layer 30. Afterwards, after dissolving perovskite compound or quantum-dot compound in DMSO or DMF, coat the solution on the photoactive layer 40 to form the filter layer 50 thereon. Finally, use the coating process of sputtering to fabricate the second electrode 60. The above coating process includes sputtering, evaporation, or physical vapor deposition. In the above example, sputtering is adopted for illustration.

In addition, an alternative process can be used to fabricate the photoactive layer 40 for the structure of photodiode according to the present embodiment. The perovskite compound or quantum-dot compound can be used as the material for the photoactive layer 40. After dissolving perovskite compound or quantum-dot compound in DMSO or DMF, coat the solution on the electron transport layer 30 to form the photoactive layer 40. The photoactive layer 40 is located on the electron transport layer 30. Next, dissolve organic material in organic solvent and coat the solution on the photoactive layer 40 to form the filter layer 50. Finally, use the coating process of sputtering to fabricate the second electrode 60. The above coating process includes sputtering, evaporation, or physical vapor deposition. In the above example, sputtering is adopted for illustration.

Figure 2A:
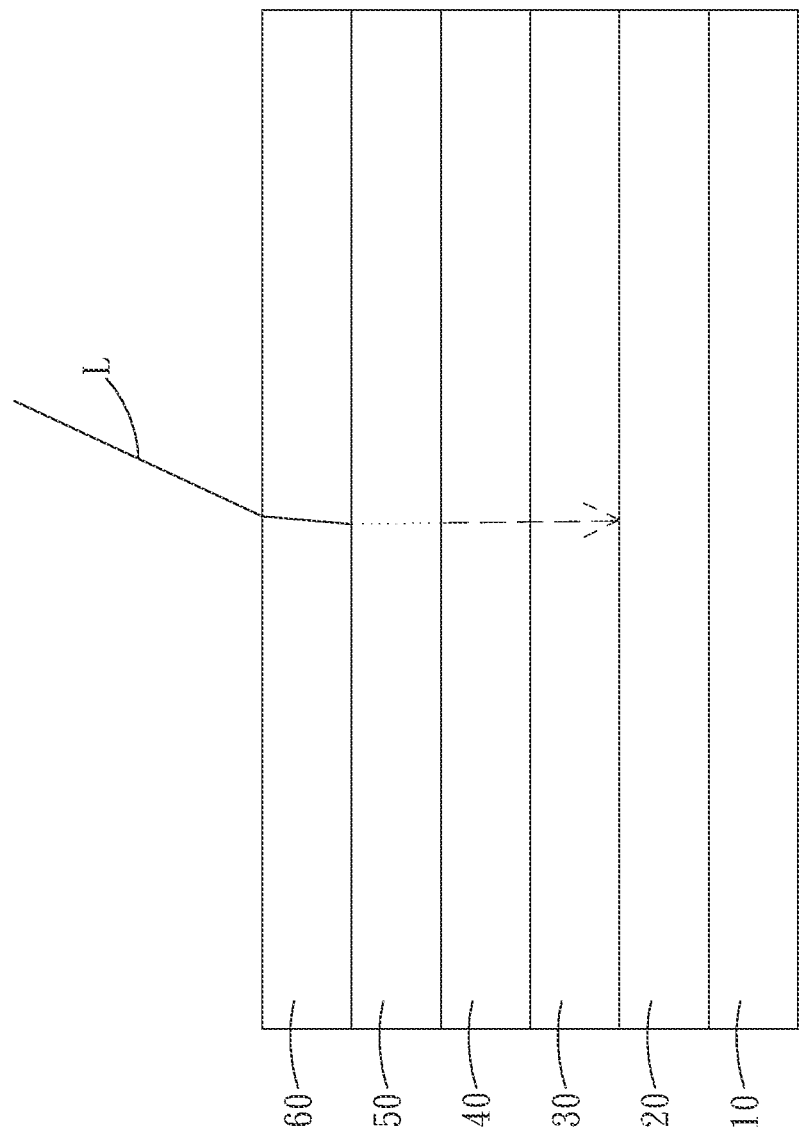
FIG. 2A shows a schematic diagram of the optical path of the external light source of the structure of photodiode according to an embodiment of the present invention.
Figure 2B:
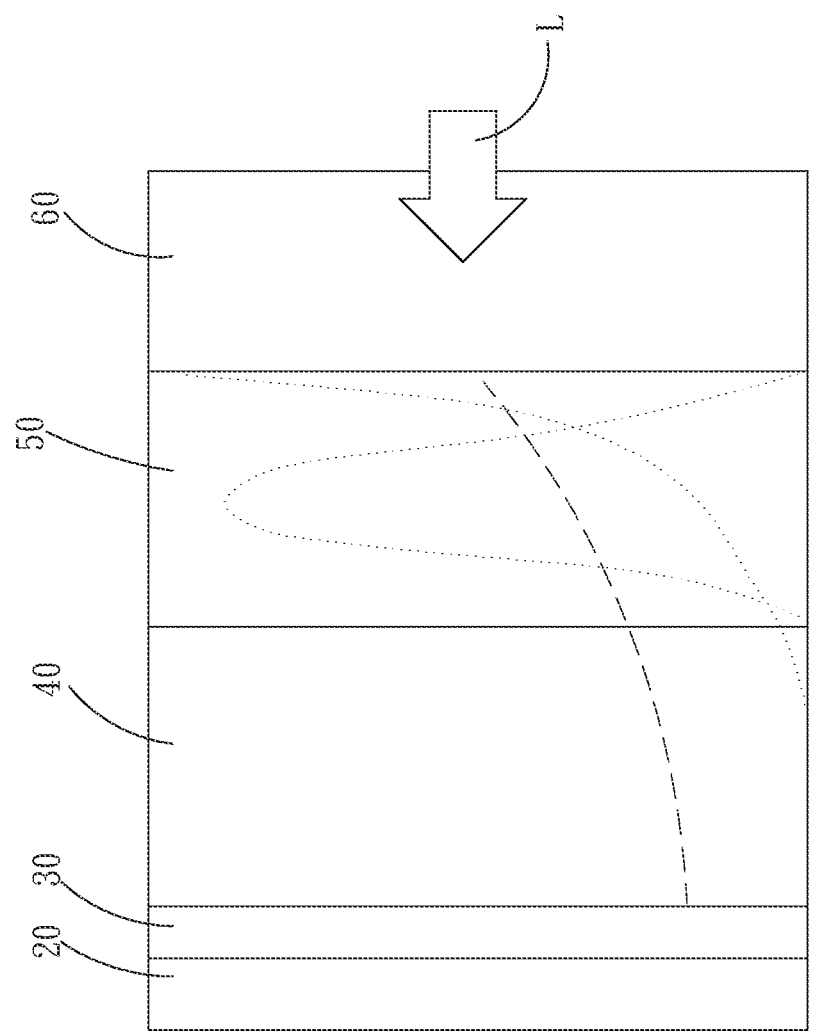
FIG. 2B shows a schematic diagram of filtering of the structure of photodiode according to an embodiment of the present invention.

The absorption spectrum and optical field distribution of the structure of photodiode with self-filtering will be illustrated. Please refer to FIG. 2A, which shows a schematic diagram of the optical path of the external light source of the structure of photodiode according to an embodiment of the present invention, and to FIG. 2B, which shows a schematic diagram of light-filtering of the photodiode structure according to an embodiment of the present invention. According to the present embodiment, to achieve effective filtering, the material of the filter layer 50 must meet the following criteria:

(1) The materials of the solvent system used for the filter layer 50 is different from the one for the photoactive layer 40. The solvent for the filter layer 50 will not immediately dissolve the photoactive layer 40. According to the embodiment, when the photoactive layer 40 is formed by organic semiconductor (generally, using the combination of o-xylene, toluene, chloroform, chlorobenzene, dichlorobenzene as the solvent), the filter layer 50 can be the compound formed by perovskite lattices (generally, using the combination of DMSO and DMF as the solvent). Alternatively, the filter layer 50 can use polar solvent (for example, alcohols or water-soluble solvent) with distributed quantum dots or other compound semiconductors.

(2) If perovskite compounds or quantum-dot compounds are used as the photoactive layer 40, since the materials have little mutual solubility with normal coating liquid of organic semiconductor material, so organic semiconductor materials can be used as the filter layer 50.

(3) The filter layer 50 must meet the requirement for charge transport as well. Its material must meet the following embodiment principles: HOMO donor≤HOMO FL or HOMO PAL≤HOMO FL, and HOMO FL≤HOMO HTL (The direction of HOMO is the distance away from the vacuum level). Thereby, energy levels will be formed between the filter layer 50 and the photoactive layer 40. In other words, the energy level of the filter layer 50 is higher than that of the photoactive layer 40 to meet the requirement of forming effective charge transport for the photodiode structure.

(4) To achieve effective charge collection narrowing (CCN) for the photodiode structure, the filter layer 50 should absorb the external light source with wavelengths shorter than the cutoff wavelength of the photoactive layer 40. Thereby, in selecting the energy gap (Eg) of the filter layer 50, the first energy gap value of the photoactive layer 40 should smaller than the second energy gap value of the filter layer 50. In other words, the photoactive layer 40 and the filter layer 50 must meet the conditions: Eg FL≥Eg donor and/or Eg acceptor or Eg FL≥Eg PAL.

In other words, when an external light source L, for example, with wavelengths between 300 nm and 1200 nm, enters the filter layer 50 and then the photoactive layer 40 from the second electrode 60, because the second energy gap value of the filter layer 50 is greater than the first energy gap value of the photoactive layer 40 and the filter layer 50 with larger energy gap absorbs short wavelengths, the short wavelengths (the dotted line in FIG. 2A and FIG. 2B, wavelengths between 300 nm and 1200 nm) of the external light source L will be filtered and allowing the long wavelengths (the dashed line in FIG. 2A and FIG. 2B, wavelengths greater than 700 nm) of the external light source L to enter the photoactive layer 40. The photoactive layer 40 converts the external light source L to a current value and transmits the current value outwards via the first electrode 20 and the second electrode 60.

The above filter layer 50 filters the short wavelengths in the external light source L and allows the long wavelengths of the external light source L to enter the photoactive layer 40. Depending on the selected material, the filter layer 50 will block the short wavelengths of the external light source L and allows the long wavelengths of the external light source L to enter the photoactive layer 40. Some examples will be illustrated in the following:

(A) When the 300 nm~750 nm short wavelengths of the external light source L is filtered by the filter layer 50 (using the material $CH_3NH_3PbI_3$), the light with wavelengths greater than 750 nm will pass through the filter layer 50 and enter the photoactive layer 40 (using the material PM6 as the donor and Y6 as the acceptor).

(B) When the 250 nm~620 nm short wavelengths of the external light source L is filtered by the filter layer 50 (using the material P3HT), the light with wavelengths greater than 620 nm will pass through the filter layer 50 and enter the photoactive layer 40 (using the material $CH_3NH_3PbI_3$).

(C) When the 300 nm~600 nm short wavelengths of the external light source L is filtered by the filter layer 50 (using the material CdSe), the light with wavelengths greater than 600 nm will pass through the filter layer 50 and enter the photoactive layer 40 (using the material PBDB-Ta s the donor and N2200 as the acceptor).

(D) When the 200 nm~450 nm short wavelengths of the external light source L is filtered by the filter layer 50 (using the material ZnS), the light with wavelengths greater than 450 nm will pass through the filter layer 50 and enter the photoactive layer 40 (using the material P3HT as the donor and PCBM as the acceptor).

The structure of photodiode according to the present embodiment will adjust the material of the filter layer 50 and the material of the corresponding photoactive layer 40 according to the wavelengths to be filtered. Thereby, the present invention is not limited to the above wavelengths.

Please refer to FIG. 3, which shows a schematic diagram of the structure of photodiode according to another embodiment of the present invention. As shown in the figure, the structure of photodiode according to the present embodiment further comprises a hole transport layer 55 disposed between the filter layer 50 and the second electrode 60. The device structure according to the present embodiment is identical to the one according to the previous embodiment. Hence, the details will not be described again.

The hole transport layer 55 is selected from the group consisting of PEDOT:PSS, $MoO_3$, NiO, $V_2O_5$, $WO_3$, CuSCN, spiro-MeOTAD, and PTAA.

The main function of the hole transport layer 55 is to help transporting holes to the second electrode 60 as well as blocking electron transport.

According to the above embodiments, the present invention provides a structure of photodiode. The filter layer is disposed on the photoactive layer for directly filtering specific wavelengths of the external light source and achieving self-filtering effect. Thanks to the self-filtering effect, the color filter adopted in the photodiode according to the prior art can be reduced. Thereby, the size of the photodetector according to the present invention can be shrunk and the fabrication costs can be reduced as well.

What is claimed is:

1. A structure of photodiode, converting an external light source to a current value, comprising:
    a substrate;
    a first electrode, disposed on said substrate;
    an electron transport layer, disposed on said first electrode;
    a photoactive layer, disposed on said electron transport layer, and having a first energy gap value;
    a filter layer, disposed on said photoactive layer, and having a second energy gap value; and
    a second electrode, disposed on said filter layer;
    where said second energy gap value is greater than said first energy gap value; said second energy gap value and said first energy gap value have an energy gap ratio; and said energy gap ratio is greater than 1 and less than or equal to 3.

2. The structure of photodiode of claim 1, wherein said substrate is selected from silicon substrate, polyimide substrate, glass substrate, polyethylene naphthalate substrate, polyethylene terephthalate substrate, sapphire substrate, quartz substrate, or ceramic substrate.

3. The structure of photodiode of claim 1, wherein said first electrode is a transparent electrode or a metal electrode, wherein said transparent electrode is selected from the group consisting of metal oxide, conductive polymer, graphene, carbon nanotube, metal nanowire and metal mesh and the mixture thereof; and said metal electrode is selected from the group consisting of aluminum, silver, gold, copper, tungsten, molybdenum, titanium and the mixture thereof.

4. The structure of photodiode of claim 1, wherein said electron transport layer is selected from the group consisting of $SnO_2$, ZnO, $TiO_2$, $Cs_2CO_3$, $Nb_2O_5$, PDMAEMA, and PFN—Br.

5. The structure of photodiode of claim 1, further comprising a hole transport layer disposed between said filter layer and said second electrode.

6. The structure of photodiode of claim 5, wherein said hole transport layer is selected from the group consisting of PEDOT:PSS, $MoO_3$, NiO, $V_2O_5$, $WO_3$, CuSCN, spiro-MeOTAD, and PTAA.

7. The structure of photodiode of claim 1, wherein said photoactive layer is selected form the group consisting of P3HT, PCBM, PTB7, N2200, PM6, PBDB-T, Y6, IT4F, $CH_3NH_3PbI_3$, $CsPbI_3$, $CH_3NH_3PbBr_3$, $CsPbBr_3$, ZnS, CdSe, ZnSe, CdS and InP.

8. The structure of photodiode of claim 1, wherein said filter layer is selected from the group consisting of P3HT, PTB7, PM6, PBDB-T, $CH_3NH_3PbI_3$, $CsPbI_3$, $CH_3NH_3PbBr_3$, $CsPbBr_3$, ZnS, CdSe, ZnSe, CdS, and InP.

9. The structure of photodiode of claim 1, wherein said photoactive layer further includes at least one donor compound and at least one acceptor compound.

10. The structure of photodiode of claim 1, wherein said second electrode is selected from metal oxide, metal, conductive polymer, carbon-based conductor, metal compound, or the mixture thereof.

* * * * *